(12) United States Patent
Lu

(10) Patent No.: US 8,018,032 B2
(45) Date of Patent: Sep. 13, 2011

(54) SILICON SUBSTRATE AND CHIP PACKAGE STRUCTURE WITH SILICON BASE HAVING STEPPED RECESS FOR ACCOMMODATING CHIP

(75) Inventor: Chih-Wei Lu, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 303 days.

(21) Appl. No.: 12/347,796

(22) Filed: Dec. 31, 2008

(65) Prior Publication Data

US 2010/0164092 A1 Jul. 1, 2010

(51) Int. Cl.
*H01L 23/13* (2006.01)
(52) U.S. Cl. ........ 257/622; 257/676; 257/700; 257/730; 257/784; 257/E23.008
(58) Field of Classification Search .................. 257/619
See application file for complete search history.

(56) References Cited

U.S. PATENT DOCUMENTS

| 5,926,695 | A  | * | 7/1999 | Chu et al. ...................... 438/111 |
| 7,087,991 | B2 | * | 8/2006 | Chen et al. ..................... 257/700 |
| 7,192,810 | B2 | * | 3/2007 | Tabrizi ........................... 438/125 |
| 2004/0188782 | A1 | * | 9/2004 | Fujii ............................... 257/415 |

FOREIGN PATENT DOCUMENTS

| TW | 170815 | 10/1991 |
| TW | 291604 | 11/1996 |
| TW | 495936 | 7/2002 |
| TW | 529188 | 4/2003 |

* cited by examiner

*Primary Examiner* — Stephen W Smoot
(74) *Attorney, Agent, or Firm* — J.C. Patents

(57) ABSTRACT

A semiconductor process is provided. First, a silicon base is provided. Next, a surface of the silicon base is partially exposed and at least a stair structure is formed on the silicon base by etching the surface of the silicon base. The stair structure has a first notch with a first depth and a second notch with a second depth. The first depth is smaller than the second depth, and a diameter of the first notch is larger than a diameter of the second notch. A final insulating layer and a metal seed layer are sequentially formed on the stair structure. A patterned photoresist layer is formed on the metal seed layer. A circuit layer coving exposed portions of the metal seed layer located above the first notch is formed. The patterned photoresist layer and portions of the metal seed layer disposed below the patterned photoresist layer are then removed.

8 Claims, 12 Drawing Sheets

SILICON SUBSTRATE AND CHIP PACKAGE STRUCTURE WITH SILICON BASE HAVING STEPPED RECESS FOR ACCOMMODATING CHIP

BACKGROUND OF THE INVENTION

1. Field of the Invention

The present invention relates generally to a semiconductor process, and more particularly, to a silicon substrate and a chip package structure formed by applying said semiconductor process.

2. Description of Related Art

With advance of semiconductor technologies at present, integrated circuit (IC) chips are equipped with a great number of closely arranged transistors and a plurality of signal pads disposed on surfaces of chips. The chips, for the purpose of packaging, are often disposed on a chip package carrier, so as to form a chip package structure. Here, by applying a package process, sufficient signal paths, heat dissipating paths, and structural protection can be supplied to the chips.

At this current stage, the package technology is progressing, and various chip package structures have been continuously developed. For instance, a chip is adhered to inner leads of a lead frame or a die pad to form a thin small outline package (TSOP). Alternatively, a chip is adhered to a printed circuit board to form a ball grid array (BGA) package.

In the TSOP structure, the chip is adhered to the inner leads of the lead frame or the die pad, and a plurality of outer leads for electrically connecting external devices are disposed at edges of the TSOP structure. Since the outer leads are uncovered by a molding compound, it is likely for the outer leads to be affected by external surroundings or broken due to excessive lengths of the outer leads, which further poses an impact on signal transmission.

On the other hand, in the BGA package structure, an organic substrate or a ceramic substrate often serves as a carrier of the chip, and the chip is disposed behind the carrier, such that electrical signals of the chip can be routed downward to a bottom surface of the carrier through internal circuits of the carrier, and the routed electrical signals can be finally transmitted to external electronic devices through solder balls of the carrier. Since the solder balls are formed on the bottom surface of the carrier in an area array manner, the aforesaid BGA package structure is frequently used in a high pin count semiconductor device. Nonetheless, an entire height of the BGA package structure is approximately 1.0~1.4 mm, which is not compliant with the demands on miniaturization (i.e., the height is smaller than 0.5 mm).

SUMMARY OF THE INVENTION

The present invention is directed to a semiconductor process for manufacturing a silicon substrate which serves as a chip carrier for wire bonding.

The present invention is further directed to a silicon substrate serving as a chip carrier for wire bonding.

The present invention is further directed to a chip package structure with a reduced thickness.

In the present invention, a semiconductor process is provided. First, a silicon base is provided. Next, a surface of the silicon base is partially exposed, and at least a stair structure is formed on the silicon base by etching the surface of the silicon base. The stair structure has a first notch with a first depth and a second notch with a second depth. The first depth is smaller than the second depth, and a diameter of the first notch is larger than a diameter of the second notch. A final insulating layer is then formed on the stair structure. A metal seed layer is formed on the final insulating layer. A patterned photoresist layer is formed on the metal seed layer. Here, the patterned photoresist layer covers portions of the metal seed layer where a circuit layer is not to be formed, and the patterned photoresist layer exposes the other portions of the metal seed layer where the circuit layer is to be formed. Next, the circuit layer is formed, and the circuit layer covers the exposed portions of the metal seed layer. Thereafter, the patterned photoresist layer and the covered portions of the metal seed layer disposed below the patterned photoresist layer are removed.

According to an embodiment of the present invention, the stair structure is formed by first forming a first insulating layer on the silicon base. Next, a first patterned photoresist mask is formed on the first insulating layer. A portion of the first insulating layer exposed by the first patterned photoresist mask is etched with use of the first patterned photoresist mask as an etching mask, so as to form a patterned first insulating layer. The first patterned photoresist mask is then removed. After that, the first notch with the first depth is formed on the silicon base by etching the silicon base exposed by the patterned first insulating layer with use of the patterned first insulating layer as an etching mask. Thereafter, the first insulating layer is removed. A second insulating layer is then formed in the first notch, and the second insulating layer covers the first notch. A second patterned photoresist mask is formed on the second insulating layer. A portion of the second insulating layer exposed by the second patterned photoresist mask is etched with use of the second patterned photoresist mask as an etching mask, so as to form a patterned second insulating layer. The second patterned photoresist mask is then removed. After that, the second notch with the second depth is formed on the silicon base by etching the silicon base exposed by the patterned second insulating layer with use of the patterned second insulating layer as an etching mask. Next, the second insulating layer is removed, and the stair structure is formed.

According to an embodiment of the present invention, a material of the first insulating layer includes silicon oxide or silicon nitride.

According to an embodiment of the present invention, a material of the second insulating layer includes silicon oxide or silicon nitride.

According to an embodiment of the present invention, the circuit layer includes a first metal layer and a second metal layer. The first metal layer covers the exposed portions of the metal seed layer located above the first notch. The second metal layer covers the first metal layer.

According to an embodiment of the present invention, the first metal layer is a Ni layer, and the second metal layer is an Au layer.

According to an embodiment of the present invention, after the patterned photoresist layer and the covered portions of the metal seed layer disposed below the patterned photoresist layer are removed, the semiconductor process further includes disposing at least a chip in the second notch at first. An upper surface of the chip is lower than the second metal layer of the circuit layer located in the first notch. Next, a wire bonding process is performed to connect the chip to the second metal layer of the circuit layer through a plurality of conductive wires. The stair structure is then filled with a molding compound which encapsulates the final insulating layer, the circuit layer, the metal seed layer, the chip, and the conductive wires. After that, a portion of the molding compound and a portion of the circuit layer are thinned, such that the molding compound and the first metal layer are substantially aligned to each other. Thereafter, the silicon base and the chip are thinned, so as to expose a lower surface of the chip. Finally, at least a metal pad is formed on the first metal layer of the circuit layer. According to an embodiment of the present invention, a material of the at least a metal pad includes gold.

According to an embodiment of the present invention, a material of the final insulating layer includes silicon oxide.

According to an embodiment of the present invention, a method of forming the metal seed layer includes physical vapor deposition (PVD).

According to an embodiment of the present invention, the metal seed layer is a titanium-nickel (Ti/Ni) composite layer.

In the present invention, a silicon substrate formed by applying said semiconductor process is provided, wherein the final insulating layer covers the stair structure, the circuit layer covers the exposed portions of the metal seed layer located above the first notch, and the second notch is used to accommodate a chip.

According to an embodiment of the present invention, the chip is electrically connected to the circuit layer through a plurality of conductive wires.

In the present invention, a chip package structure including a silicon base, an insulating layer, a metal seed layer, a circuit layer, a chip, a molding compound, and at least a metal pad is provided. The silicon base has a stair structure. The stair structure has a first notch with a first depth and a second notch with a second depth. The first depth is smaller than the second depth, and a diameter of the first notch is larger than a diameter of the second notch. The insulating layer is disposed on the silicon base and covers the first notch and the second notch. The metal seed layer covers the insulating layer located above the first notch. The circuit layer covers the metal seed layer located above the first notch. The chip is disposed in the second notch, wherein an upper surface of the chip is lower than the circuit layer, and the chip is electrically connected to the circuit layer through a plurality of conductive wires. The molding compound encapsulates the insulating layer, the metal seed layer, the circuit layer, the chip, and the conductive wires. The molding compound and the circuit layer are substantially aligned to each other. The at least a metal pad is disposed on the circuit layer and exposed by the molding compound.

According to an embodiment of the present invention, a material of the insulating layer includes silicon oxide.

According to an embodiment of the present invention, the metal seed layer is a Ti/Ni composite layer.

According to an embodiment of the present invention, the circuit layer includes a first metal layer and a second metal layer. The first metal layer covers the metal seed layer, and the second metal layer covers the first metal layer. The first metal layer is a Ni layer, and the second metal layer is an Au layer.

According to an embodiment of the present invention, a material of the at least a metal pad includes gold.

Based on the above, the silicon substrate formed by performing the semiconductor process of the present invention has a stair structure. Hence, when the chip is disposed in the second notch of the stair structure, the chip is electrically connected to the silicon substrate through performing a wire bonding process, and the chip is encapsulated by the molding compound for forming the chip package structure. The silicon base and the chip are then thinned, such that the chip package structure can have a reduced thickness.

In order to make the above and other features and advantages of the present invention more comprehensible, embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
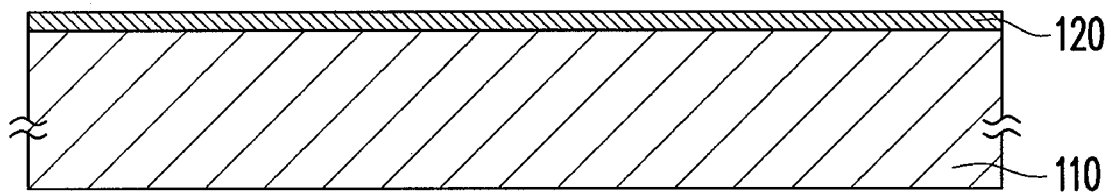
FIGS. 1A to 1P are schematic cross-sectional view illustrating a semiconductor process according to an embodiment of the present invention.
Figure 1B:
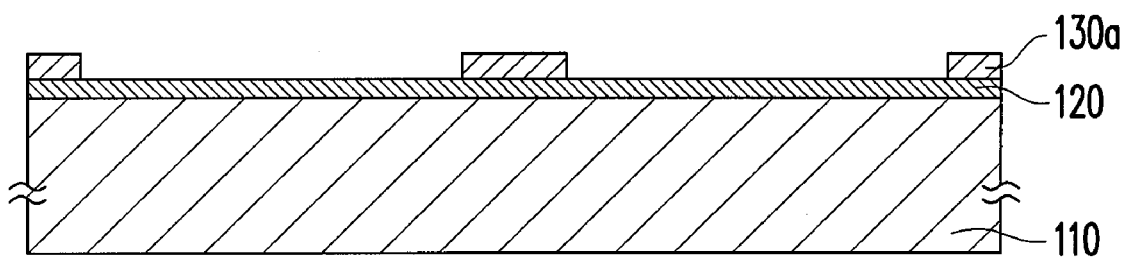
Figure 1C:
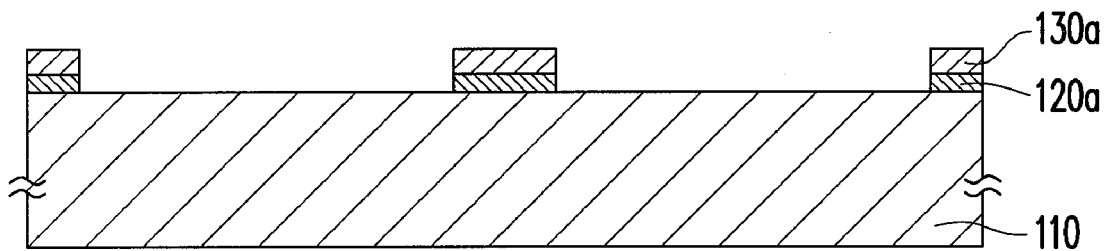
Figure 1D:
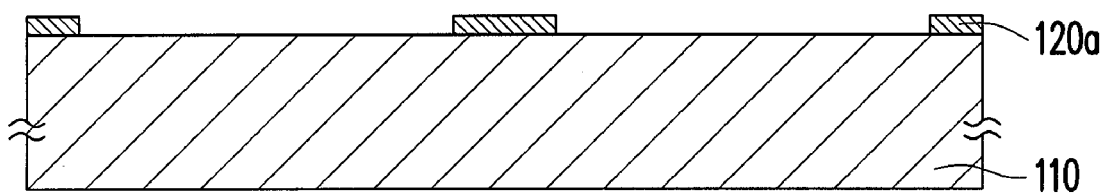
Figure 1E:
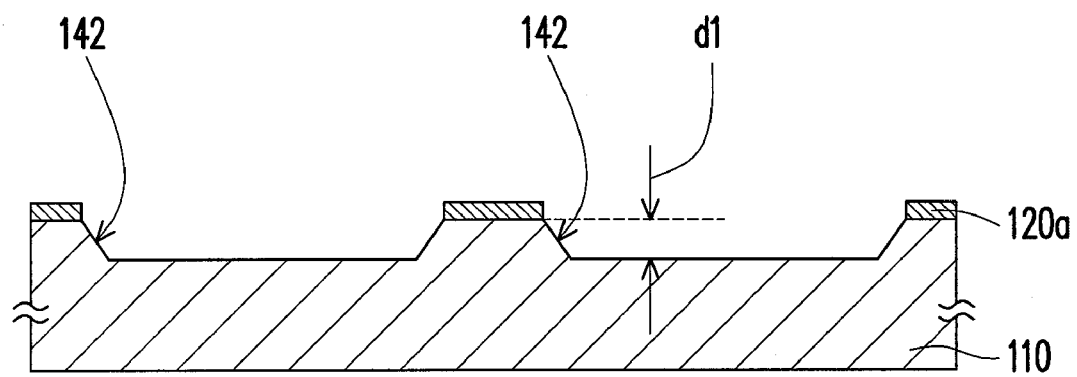
Figure 1F:
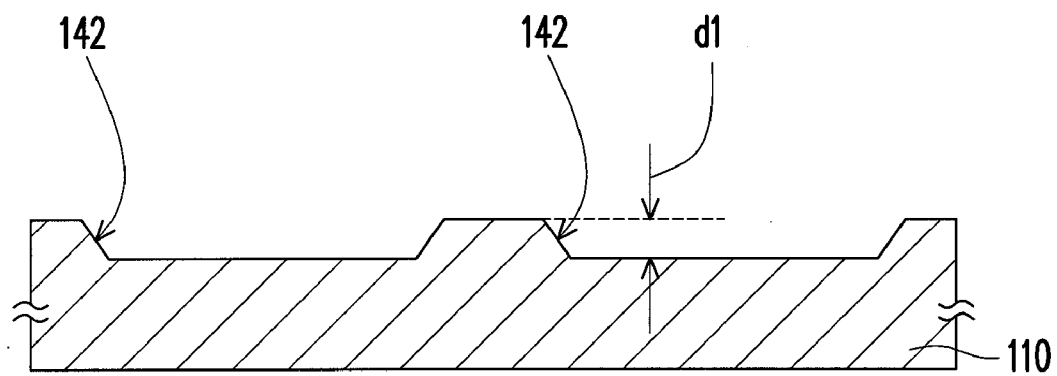
Figure 1G:
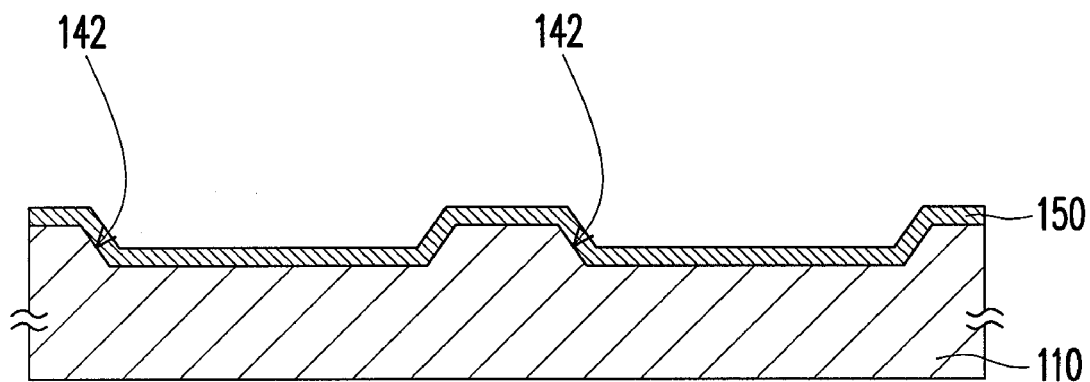
Figure 1H:
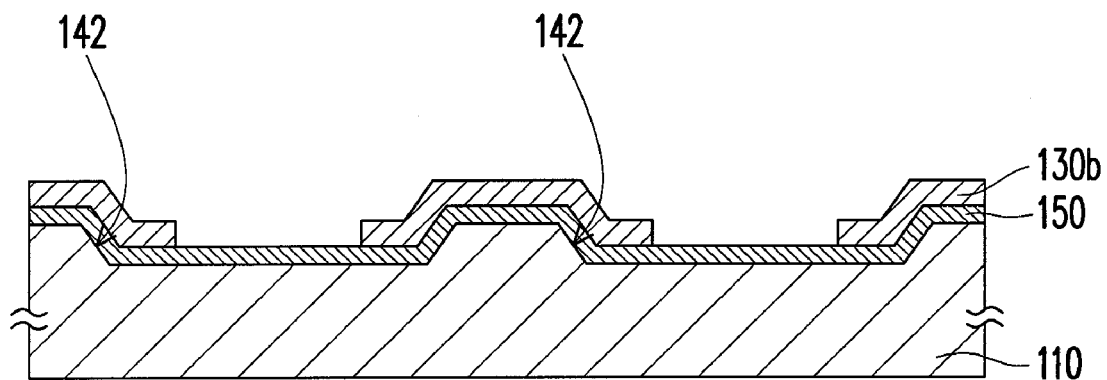
Figure 1I:
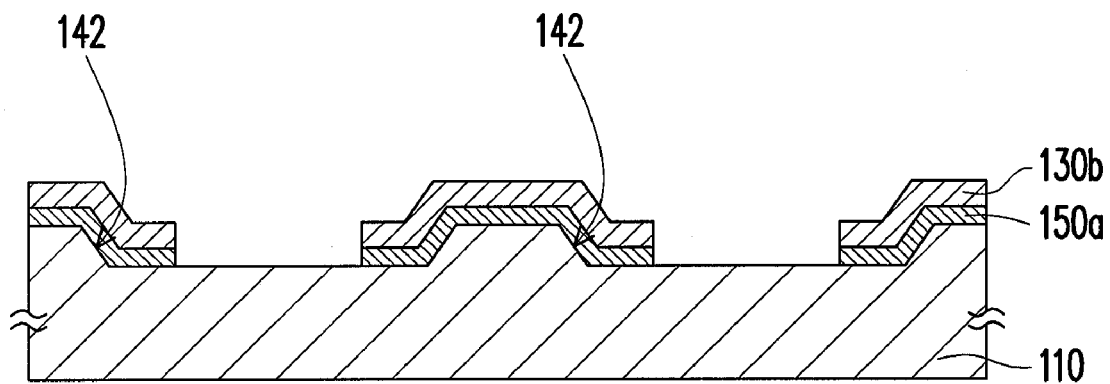
Figure 1J:
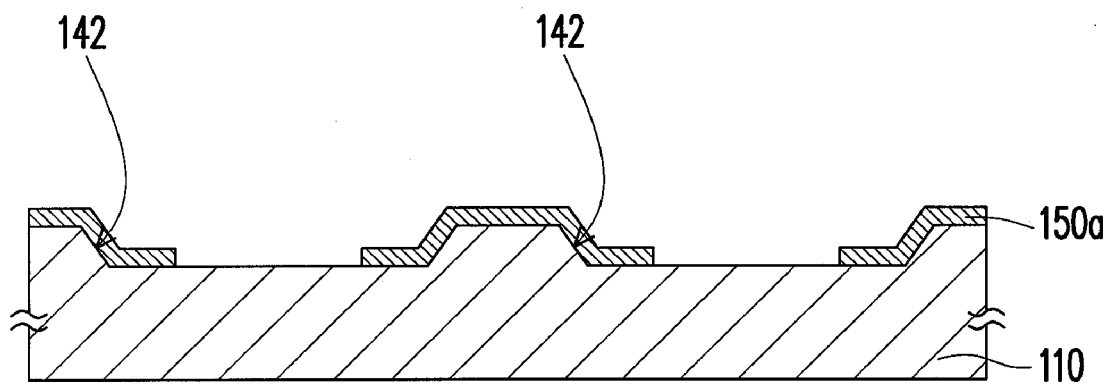
Figure 1K:
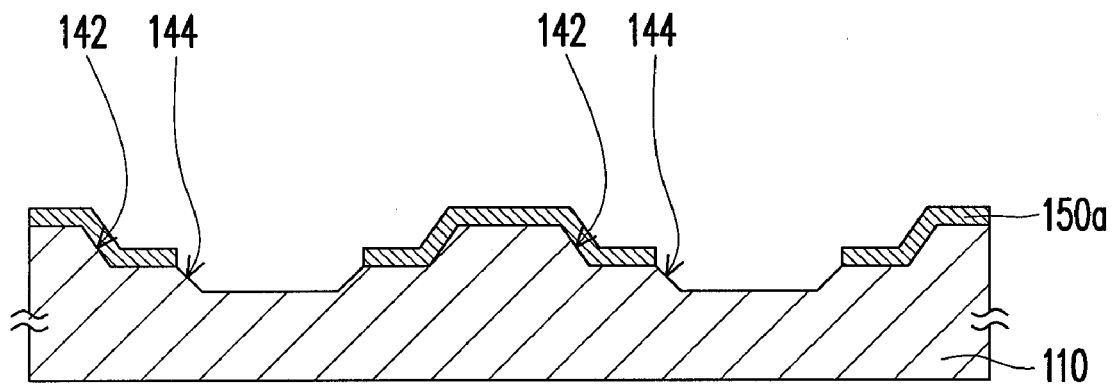
Figure 1L:
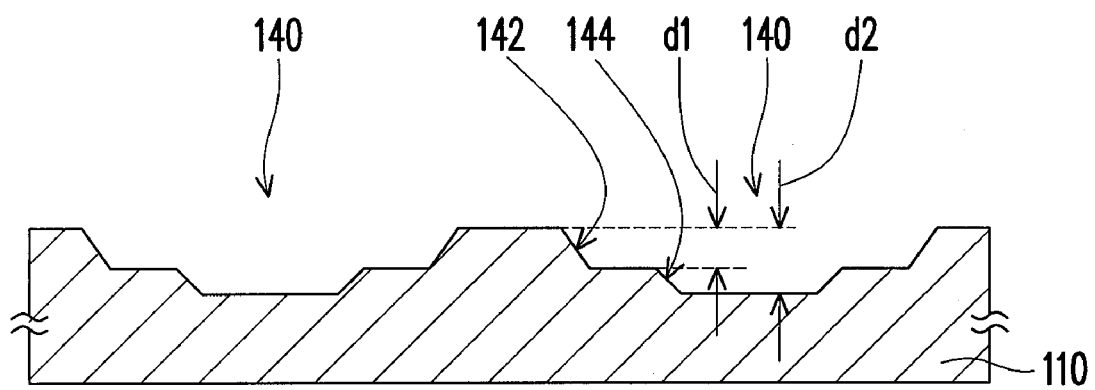
Figure 1M:
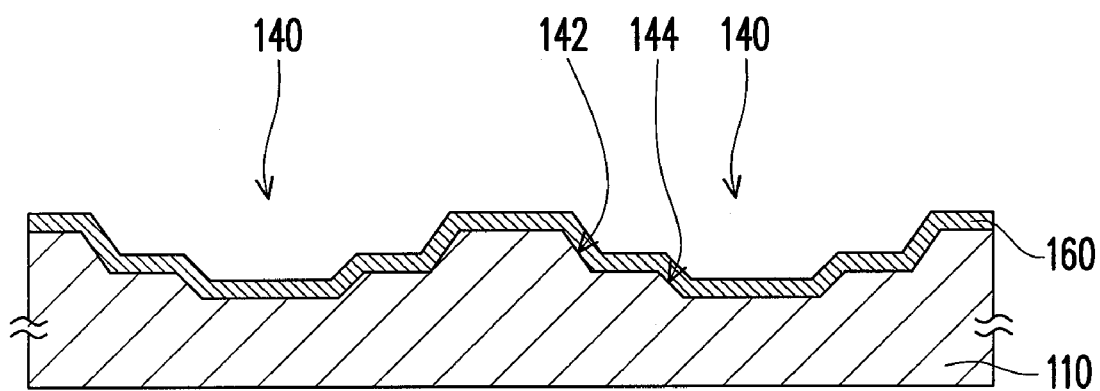
Figure 1N:
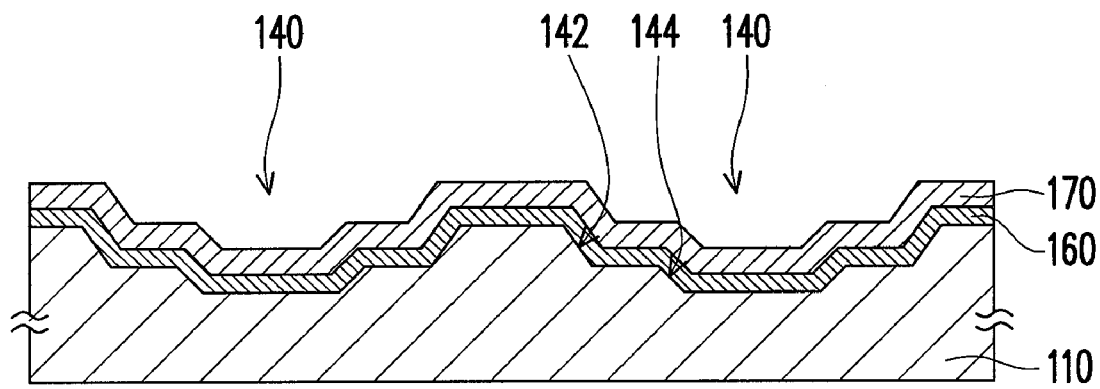
Figure 1O:
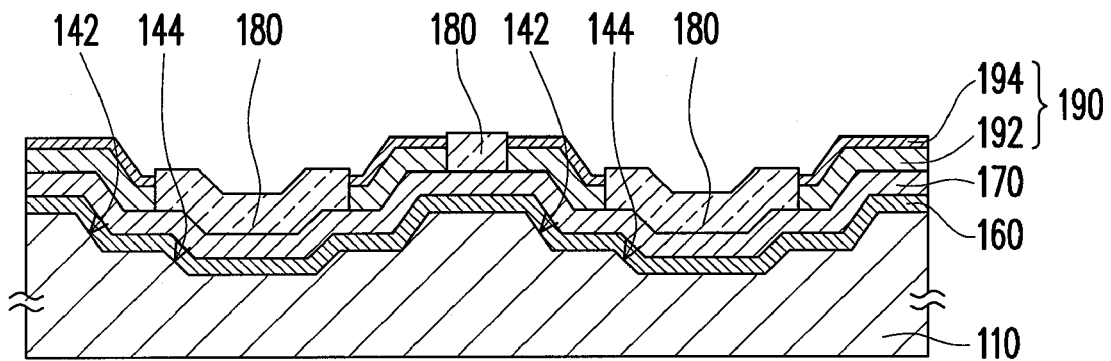
Figure 1P:
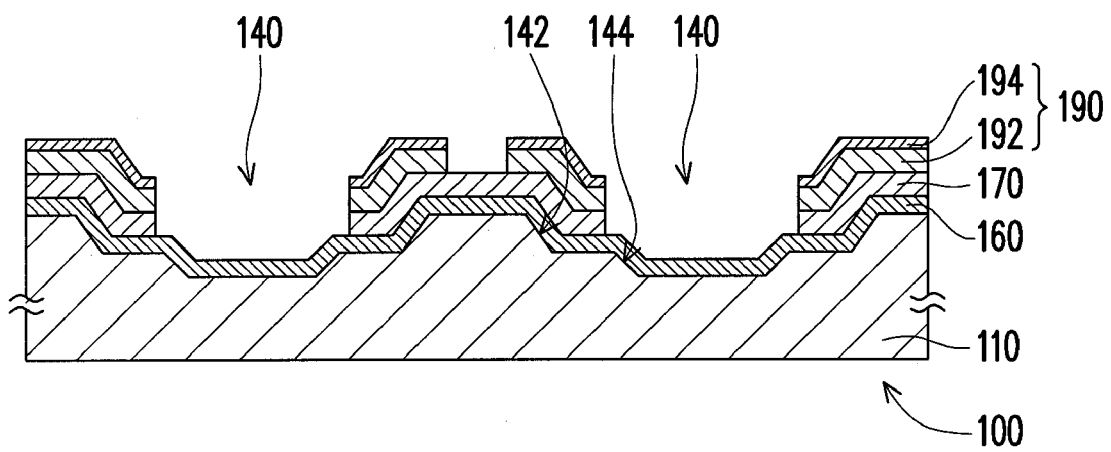

FIGS. 1A to 1P are schematic cross-sectional view illustrating a semiconductor process according to an embodiment of the present invention. Referring to FIG. 1A, in the semiconductor process of the present embodiment, a silicon base 110 is provided at first, and a first insulating layer 120 is formed on the silicon base 110. In the present embodiment, a material of the first insulating layer 120 includes silicon oxide and silicon nitride.

Referring to FIG. 1B, a first patterned photoresist mask 130a is then formed on the first insulating layer 120. Next, at least a stair structure 140 (shown in FIG. 1L) is formed on the silicon base 110. In detail, referring to FIGS. 1C and 1D, the at least a stair structure 140 is formed by first etching a portion of the first insulating layer 120 exposed by the first patterned photoresist mask 130a with use of the first patterned photoresist mask 130a as an etching mask, so as to form a patterned first insulating layer 120a. Next, the first patterned photoresist mask 130a is removed to expose the patterned first insulating layer 120a located below the first patterned photoresist mask 130a. After that, referring to FIG. 1E, at least a first notch 142 with a first depth d1 is formed on the silicon base 110 by etching the silicon base 110 exposed by the patterned first insulating layer 120a with use of the patterned first insulating layer 120a as an etching mask. In FIG. 1E, only two first notches 142 are schematically illustrated. In the present embodiment, the silicon base 110 exposed by the patterned first insulating layer 120a is etched by performing a wet etching process with use of potassium hydroxide (KOH) as an etchant.

Thereafter, referring to FIG. 1F, the patterned first insulating layer 120a is removed to expose the silicon base 110. Referring to FIG. 1G, a second insulating layer 150 is then formed in the first notches 142 and covers the first notches 142. According to the present embodiment, a material of the second insulating layer 150 is substantially the same as the material of the first insulating layer 120, e.g., silicon nitride or silicon oxide. In addition, the second insulating layer 150 is formed in substantially the same manner as that of the first insulating layer 120.

Referring to FIG. 1H, a second patterned photoresist mask 130b is then formed on the second insulating layer 150. As indicated in FIGS. 1I and 1J, first, the second insulating layer 150 exposed by the second patterned photoresist mask 130b is etched with use of the second patterned photoresist mask 130b as an etching mask, so as to form a patterned second insulating layer 150a. Next, the second patterned photoresist mask 130b is removed to expose the patterned second insulating layer 150a located below the second patterned photoresist mask 130b. Referring to FIGS. 1K and 1L, at least a second notch 144 with a second depth d2 is formed on the silicon base 110 by etching the silicon base 110 exposed by the patterned second insulating layer 150a with use of the patterned second insulating layer 150a as an etching mask. In FIG. 1K, only two second notches 144 are schematically illustrated. Thereafter, the patterned second insulating layer 150a is removed, and the stair structure is formed.

Specifically, in the present embodiment, the second notches 144 are respectively connected to the first notches 142, and the first depth d1 is smaller than the second depth d2. Besides, diameters of the first notches 142 are greater than diameters of the second notches 144, respectively. That is to say, in comparison with the first notches 142, the second notches 144 have relatively small diameters and rather great depth. In the present embodiment, a method of etching the second insulating layer 150 exposed by the second patterned photoresist mask 130b and the silicon base 110 underlying the second insulating layer 150 is the same as that of etching the first insulating layer 120 exposed by the first patterned photoresist mask 130a and the silicon base 110 underlying the first insulating layer 120, i.e., by performing the wet etching process with use of the KOH as the etchant.

Referring to FIG. 1L, in the present embodiment, the second insulating layer 150 is removed, so as to form at least a stair structure 140. In FIG. 1L, only two stair structures 140 are depicted. Here, a method of etching the first insulating layer 120 and the second insulating layer 150 is, for example, performing a wet etching process. So far, the stair structures 140 are completely formed on the silicon base 110.

Referring to FIG. 1M, a final insulating layer 160 is then formed on the stair structures 140. Here, the final insulating layer 160 covers the first notches 142 and the second notches 144, so as to insulate the silicon base 110. In the present embodiment, a material of the final insulating layer 160 includes silicon oxide, and the final insulating layer 160 is formed by heating the silicon base 110 to oxidize the surface of the silicon base 110. The oxidized portion of the silicon base 110 is the so-called final insulating layer 160.

Afterwards, as indicated in FIG. 1N, a metal seed layer 170 is formed on the final insulating layer 160. According to the present embodiment, the metal seed layer 170 is, for example, a titanium-nickel (Ti/Ni) composite layer, and a method of forming the metal seed layer 170 includes sputtering or physical vapor deposition (PVD).

Referring to FIG. 1O, a patterned photoresist layer 180 is formed on the metal seed layer 170. Here, the patterned photoresist layer 180 covers portions of the metal seed layer 170 where a circuit layer 190 is not to be formed, and the patterned photoresist layer 180 exposes the other portions of the metal seed layer 170 where the circuit layer 190 is to be formed. After that, the circuit layer 190 covering the exposed portions of the metal seed layer 170 is formed. Here, the circuit layer 190 includes a first metal layer 192 and a second metal layer 194. In the present embodiment, the first metal layer 192 is, for example, a Ni layer, and the second metal layer 194 is, for example, an Au layer.

Next, as shown in FIG. 1P, the patterned photoresist layer 180 and the covered portions of the metal seed layer 170 disposed below the patterned photoresist layer 180 are removed, so as to expose a portion of the final insulating layer 160 located above the second notches 144. In the present embodiment, the patterned photoresist layer 180 is removed by using a solvent that dissolves the patterned photoresist layer 180, for example. Besides, the covered portions of the metal seed layer 170 disposed below the patterned photoresist layer 180 are removed by performing an etching process, for example. So far, a silicon substrate 100 is completely formed on the silicon base 110 by performing the semiconductor process of the present embodiment.

In brief, the silicon substrate 100 of the present embodiment is formed by performing the semiconductor process. The patterned first insulating layer 120a and the patterned second insulating layer 150a are formed for performing the etching process on the silicon base 110 with use of the first patterned photoresist mask 130a and the second patterned photoresist mask 130b as the etching masks. The stair structures 140 comprising the first notches 142 with the first depth d1 and the second notches 144 with the second depth d2 are then formed by using the patterned first insulating layer 120a and the patterned second insulating layer 150a as the etching masks. After that, the final insulating layer 160, the metal seed layer 170, and the circuit layer 190 are formed on the silicon base 110, so as to form the silicon substrate 100 having the stair structures 140.

Additionally, in the stair structures 140 formed in the present embodiment, the first depth d1 of the first notches 142 is smaller than the second depth d2 of the second notches 144. Therefore, when the silicon substrate 100 serves as the chip carrier (not shown) for wire bonding, the second notches 144 of the stair structures 140 can accommodate a plurality of chips and, through implementation of the wire bonding process, the chips can be electrically connected to the circuit layer 190 disposed in the first notches 142. Thereby, the volume of the silicon substrate 100 and the wire bonding distance between the silicon substrate 100 and the chips can be reduced.

FIGS. 2A to 2G are schematic cross-sectional view of performing a package process on a chip with use of the silicon substrate formed by applying the semiconductor process depicted in FIG. 1P. FIG. 2H is a schematic top view of the chip package structure depicted in FIG. 2G. Note that some components are omitted in FIG. 2H for the purpose of illustration and better understanding. In the present embodiment, the silicon substrate 100 formed by performing said semiconductor process is suitable for accommodating a chip 210.

Figure 2A:
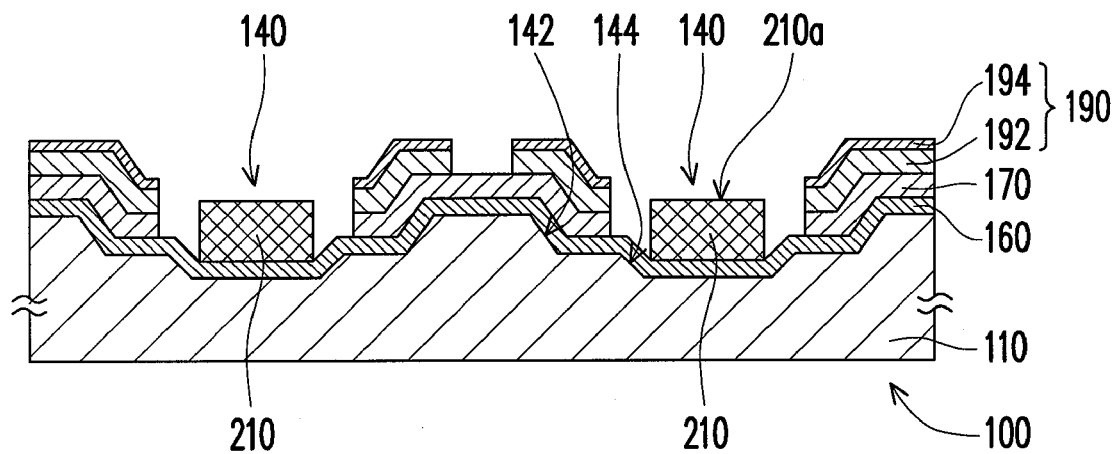
FIGS. 2A to 2G are schematic cross-sectional view of performing a package process on a chip with use of the silicon substrate formed by applying the semiconductor process depicted in FIG. 1P.

Specifically, in subsequent processes of the silicon substrate 100, referring to FIG. 2A, at least a chip 210 is disposed in the second notches 144 of the stair structures 140 at first. In FIG. 2A, only two chips 210 are schematically depicted. Here, upper surfaces 210a of the chips 210 are respectively lower than the second metal layer 194 of the circuit layer 190 in the first notches 142.

Figure 2B:
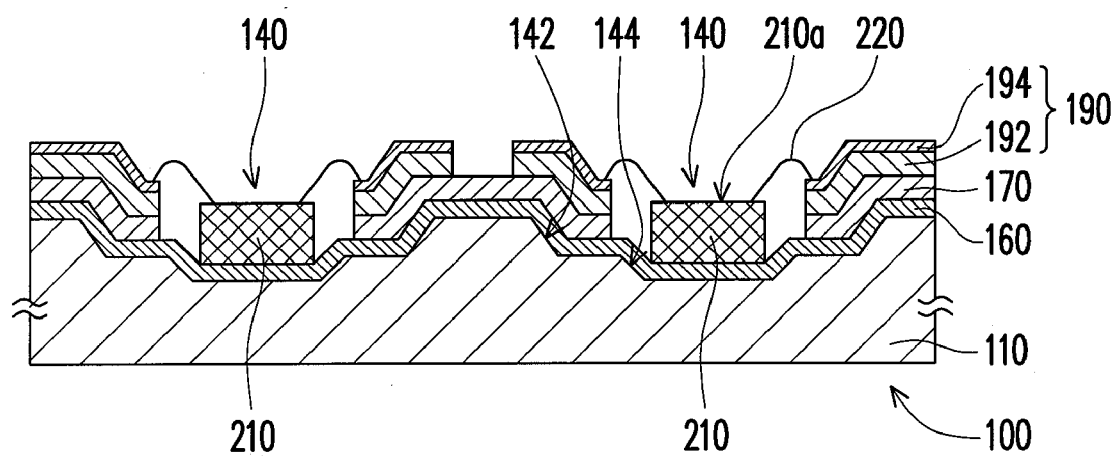

As indicated in FIG. 2B, a wire bonding process is then performed to connect the chips 210 to the second metal layer 194 of the circuit layer 190 through a plurality of conductive wires 220. Namely, in the present embodiment, the chips 210 are electrically connected to the second metal layer 194 of the circuit layer 190 through the conductive wires 220.

Figure 2C:
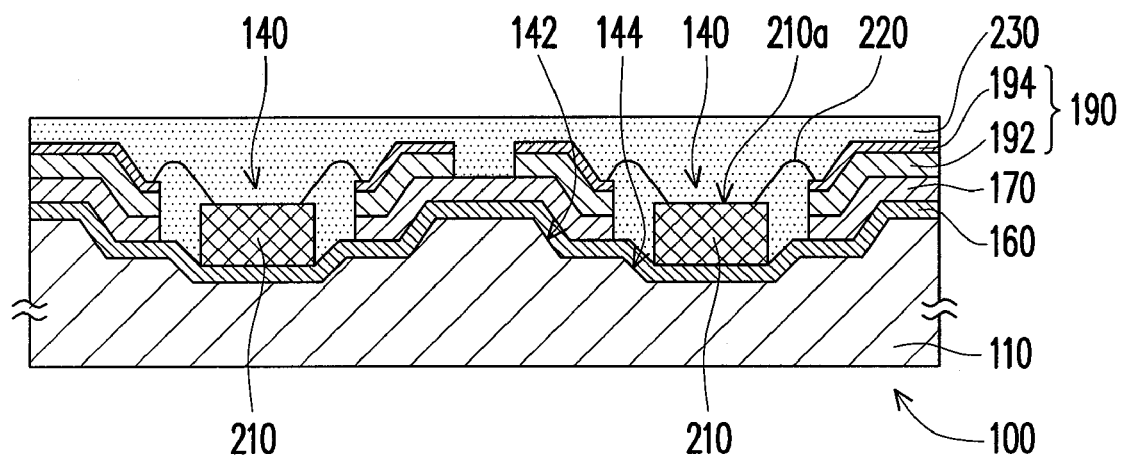
Figure 2D:
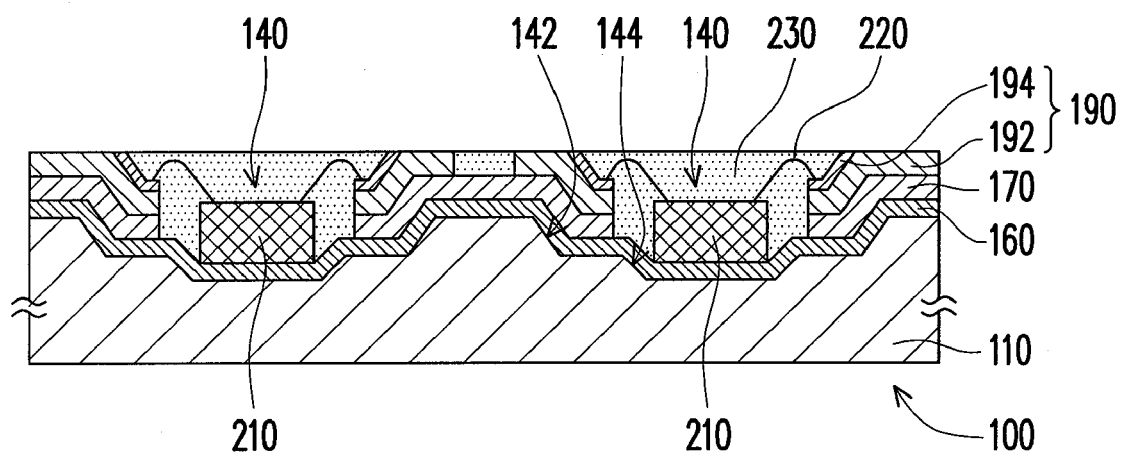

Referring to FIG. 2C, the stair structures 140 are filled with a molding compound 230 which encapsulates the circuit layer 190, the metal seed layer 170, the final insulating layer 160, the chips 210, and the conductive wires 220. Next, as indicated in FIG. 2D, a portion of the molding compound 230 and a portion of the circuit layer 190 are thinned, such that the molding compound 230 and the first metal layer 192 are substantially aligned to each other. According to the present embodiment, a method of thinning the molding compound 230 and the circuit layer 190 includes polishing.

Figure 2E:
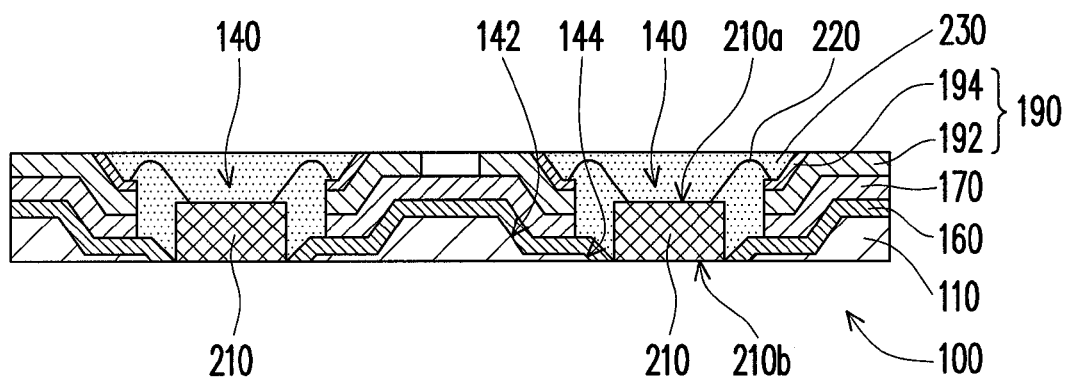
Figure 2F:
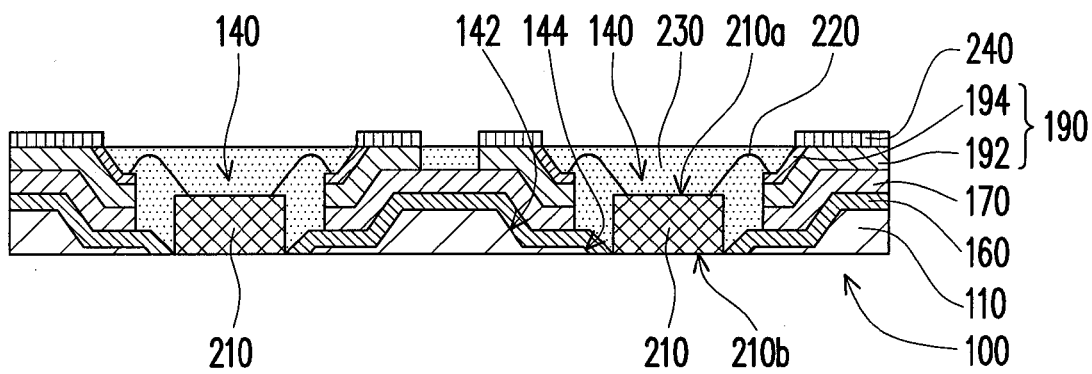
Figure 2G:
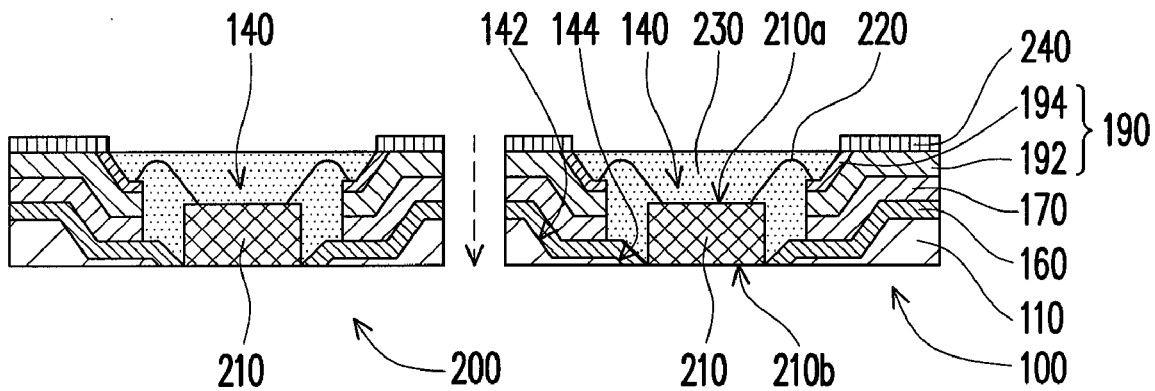
Figure 2H:
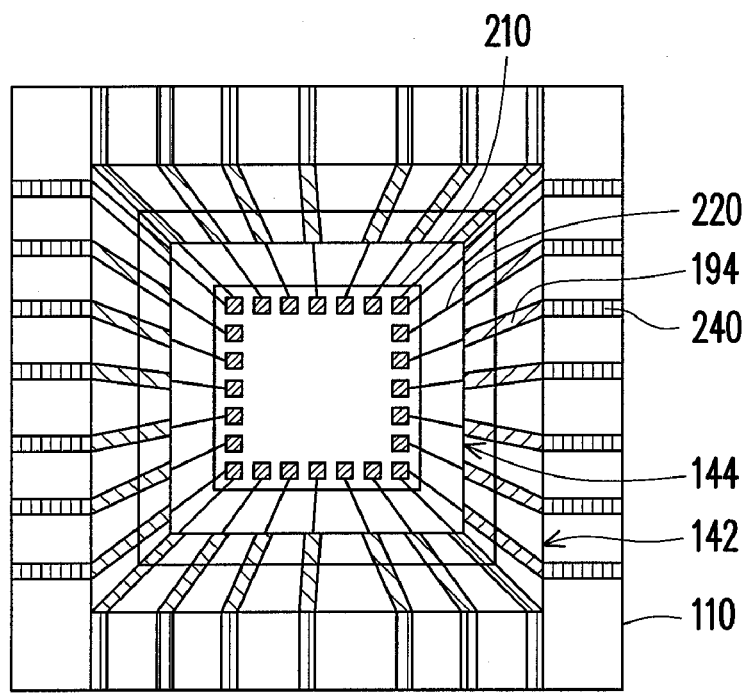
FIG. 2H is a schematic top view of the chip package structure depicted in FIG. 2G.

As indicated in FIG. 2E, a back surface of the silicon base 110 is thinned to expose bottom surfaces 210b of the chips 210 for satisfying demands on miniaturizing the package. Here, a method of thinning the silicon base 110 includes performing a polishing process or an etching process. Referring to FIG. 2F, at least a metal pad 240 is then formed on the first metal layer 192 of the circuit layer 190 and exposed by the molding compound 230. In FIG. 2F, only four metal pads 240 are schematically depicted. Here, a method of forming the metal pads 240 is, for example, electroless plating. According to an embodiment, a thickness of each of the metal pads 240 is approximately 0.1 μm. After that, referring to FIGS. 2G and 2H, a cutting process is performed with use of cutting tools to cut and separate the silicon substrate 100 along a predetermined path. Thereby, a plurality of individual chip package structures 200 can be formed. In FIG. 2G, only two chip package structures 200 are schematically illustrated.

In short, according to the manufacturing process of the chip package structure 200 in the present embodiment, the silicon substrate 100 formed by performing the semiconductor process serves as the carrier of the chips 210, and the chips 210 are electrically connected to the circuit layer 190 on the silicon base 110 through wire bonding. Moreover, a molding process is carried out to seal the chips 210 into the molding compound 230, so as to form the chip package structure 200. This chips 210 are respectively disposed in the second notches 144 of the stair structures 140, and therefore the chip package structure 200 constituted by the silicon substrate 100 and the chips 210 has a reduced thickness.

Based on the foregoing, in the silicon substrate formed by performing the semiconductor process of the present invention, the first depth of the first notch is smaller than the second depth of the second notch in the stair structure. Additionally, the diameter of the first notch is greater than the diameter of the second notch. Hence, when the chip is electrically connected to the silicon substrate through wire bonding to form the chip package structure, the silicon substrate and the back surface of the chip are simultaneously polished, so as to miniaturize the chip package structure. As such, the chip package structure can have a reduced thickness. In conclusion, the thickness of the package can be effectively reduced according to the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A silicon substrate, comprising:
   a silicon base, comprising a stair structure, wherein the stair structure has a first notch with a first depth and a second notch with a second depth, the first depth is smaller than the second depth, and a diameter of the first notch is larger than a diameter of the second notch;
   a final insulating layer, disposed on the stair structure;
   a metal seed layer, disposed on and covering the final insulating layer located above the first notch; and
   a circuit layer, disposed on the metal seed layer;
   wherein the final insulating layer covers the stair structure, the circuit layer covers the metal seed layer, and the second notch accommodates a chip.

2. The silicon substrate as claimed in claim 1, wherein the chip is electrically connected to the circuit layer through a plurality of conductive wires.

3. A chip package structure, comprising:
   a silicon base, comprising a stair structure, wherein the stair structure has a first notch with a first depth and a second notch with a second depth, the first depth is smaller than the second depth, and a diameter of the first notch is larger than a diameter of the second notch;
   an insulating layer, disposed on the silicon base and covering the first notch and the second notch;
   a metal seed layer, covering the insulating layer located above the first notch;
   a circuit layer, covering the metal seed layer located above the first notch;
   a chip, disposed in the second notch, wherein an upper surface of the chip is lower than the circuit layer, and the chip is electrically connected to the circuit layer through a plurality of conductive wires;
   a molding compound, encapsulating the insulating layer, the metal seed layer, the circuit layer, the chip, and the plurality of conductive wires, wherein the molding compound and the circuit layer are substantially aligned to each other; and
   at least a metal pad, disposed on the circuit layer and exposed by the molding compound.

4. The chip package structure as claimed in claim 3, wherein a material of the insulating layer comprises silicon oxide.

5. The chip package structure as claimed in claim 3, wherein the metal seed layer is a titanium-nickel composite layer.

6. The chip package structure as claimed in claim 3, wherein the circuit layer comprises a first metal layer and a second metal layer, the first metal layer covers the metal seed layer, and the second metal layer covers the first metal layer.

7. The chip package structure as claimed in claim 6, wherein the first metal layer is a Ni layer, and the second metal layer is an Au layer.

8. The chip package structure as claimed in claim 3, wherein a material of the at least a metal pad comprises gold.

* * * * *